United States Patent
Zhang et al.

(10) Patent No.: US 10,132,712 B1
(45) Date of Patent: Nov. 20, 2018

(54) MICRO HERMETIC SENSOR

(71) Applicant: NORTHROP GRUMMAN SYSTEMS CORPORATION, Falls Church, VA (US)

(72) Inventors: Chunbo Zhang, Manhattan Beach, CA (US); Phuong Nguyen, Fountain Valley, CA (US); Xianglin Zeng, Monterey Park, CA (US); Maria L. Tenorio, Gardena, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 262 days.

(21) Appl. No.: 15/265,135

(22) Filed: Sep. 14, 2016

(51) Int. Cl.
*G01K 17/00* (2006.01)
*G01N 25/72* (2006.01)
*G01M 3/00* (2006.01)
*H01L 21/67* (2006.01)
*H01L 21/66* (2006.01)
*H01L 23/31* (2006.01)

(52) U.S. Cl.
CPC ....... *G01M 3/002* (2013.01); *H01L 21/67288* (2013.01); *H01L 22/34* (2013.01); *H01L 23/3114* (2013.01)

(58) Field of Classification Search
CPC ........ G01N 25/72; G01N 25/18; G01N 25/20; G01N 27/20; G01K 17/00
See application file for complete search history.

(56) References Cited

U.S. PATENT DOCUMENTS

| | | | |
|---|---|---|---|
| 4,766,763 A | * | 8/1988 | Kurtz ..................... G01M 3/26 73/40 |
| 4,916,520 A | | 4/1990 | Kurashima |
| 5,633,465 A | | 5/1997 | Kaufmann et al. |
| 5,798,557 A | | 8/1998 | Salatino et al. |
| 5,814,888 A | | 9/1998 | Nishioka et al. |
| 5,955,659 A | * | 9/1999 | Gupta ..................... G01F 1/28 340/632 |
| 6,798,064 B1 | | 9/2004 | Henry et al. |

(Continued)

FOREIGN PATENT DOCUMENTS

CN    102110673 A    6/2011

OTHER PUBLICATIONS

Han, Bongtae, "Measurements of True Leak Rates of MEMS Packages" Sensors, vol. 12, 2012, pp. 3082-3104.
(Continued)

*Primary Examiner* — Gail Kaplan Verbitsky
(74) *Attorney, Agent, or Firm* — John A. Miller; Shumaker, Loop & Kendrick, LLP

(57) ABSTRACT

A sensor assembly for determining whether a hermetically sealed cavity between opposing substrate wafers in a wafer level packaged (WLP) chip is leaking. The sensor assembly includes a thermal insulating layer provided within the cavity, and a heater and temperature sensor deposited on the insulation layer. The thermal insulating layer is made of a suitable dielectric that is compatible with WLP and MMIC fabrication processes and can be, for example, benzocyclobutene (BCB) or polyimide. The sensor is responsive to a current that heats the thermal insulation layer so that heat dissipated by the thermal insulation layer is drawn away by gas between the layer and the substrate that determines the temperature of the sensor, which is detected.

20 Claims, 4 Drawing Sheets

(56) References Cited

U.S. PATENT DOCUMENTS

| | | | |
|---|---|---|---|
| 6,827,105 B1* | 12/2004 | Marble | F16K 15/148 |
| | | | 137/246 |
| 6,942,750 B2 | 9/2005 | Chou et al. | |
| 6,977,212 B2 | 12/2005 | Ammlung et al. | |
| 9,219,024 B2 | 12/2015 | Fillmore et al. | |
| 9,796,585 B2* | 10/2017 | Ehmke | B81C 1/00904 |
| 9,952,171 B2* | 4/2018 | Hunziker | G01N 27/26 |
| 2003/0217603 A1* | 11/2003 | Ishio | G01L 9/0054 |
| | | | 73/754 |
| 2004/0026365 A1* | 2/2004 | Fuertsch | G01F 1/6845 |
| | | | 216/39 |
| 2014/0174188 A1 | 6/2014 | Conrad | |
| 2016/0091378 A1* | 3/2016 | Tsai | H04R 19/005 |
| | | | 73/728 |
| 2016/0103082 A1* | 4/2016 | Kimura | G01N 33/005 |
| | | | 73/25.01 |
| 2016/0159639 A1* | 6/2016 | Van Der Wiel | B81B 7/0038 |
| | | | 257/414 |

OTHER PUBLICATIONS

Chae, Junseok et al. "A Micromachined Pirani Gauge With Dual Heat Sinks" IEEE Transactions on Advanced Packaging, vol. 28, No. 4, Nov. 2005, pp. 619-625.

Oberhammer, Joachim et al. "BCB Contact Printing for Patterned Adhesive Full-Wafer Bonded 0-Level Packages" Journal of Microelectromechanical Systems, vol. 14, No. 2, Apr. 2005, pp. 419-425.

Tilmans, H. A. C. et al. "Wafer-Level Packaged RF-MEMS Switches Fabricated in a CMOS Fab" Electronic Devices Meeting, IEDM'01 Technical Digest, International IEEE 2001, pp. 41.4.1-41.4.4.

* cited by examiner

MICRO HERMETIC SENSOR

BACKGROUND

Field

This invention relates generally to a sensor for determining whether a wafer-level package (WLP) chip is hermetically sealed and, more particularly, to a sensor for determining whether a hermetically sealed WLP chip is leaking by heating a thermal insulation layer within a sealed cavity in the chip and detecting temperature or heating power changes of the layer as a result of an increase in pressure in the cavity.

Discussion

Wafer-level packaging (WLP) of integrated circuits, such as monolithic microwave integrated circuits (MMIC), is well known. It is desirable to provide the integrated circuits in a hermetically sealed environment to prevent MMIC performance degradation from certain gases, such as moisture, hydrogen, or oxygen. Many integrated circuits are typically grown or fabricated on a semiconductor wafer and then opposing wafers are bonded together, where bonding rings are provided around the individual circuits that are bonded to provide a hermetically sealed cavity in which the integrated circuits are provided. Individual integrated circuit chips are then separated from the wafers by cutting along dice lines between the chips.

After the individual chips have been separated from the wafers, it is desirable to test the chips to ensure that they have been properly sealed before the chips are placed in a particular circuit. However, current fabrication techniques do not provide an effective way to detect leaks in the sealed cavity or monitor pressure changes in the cavity. One relatively ineffective technique has been employed that includes soaking the WLP chip in a high pressure radioactive gas and then examining radioactive traces in the WLP chip to detect leaks. If the hermetic seal of the chip allows leaks, then the radioactive gas will enter the cavity, which can be detected. However, this technique cannot monitor pressure changes in-situ and cannot detect very small leak rates, such as less than $1 \times 10^{-10}$ atm cc/sec. In another case, humidity capacitive sensors have been employed to detect leaks in hermetically sealed WLP chips that use active circuitry to sense small capacitance changes due to cavity humidity change, but which require the design and fabrication of the active circuits and need to correlate the humidity with the pressure changes or leaks inside the cavity. It has also been proposed in the art to employ a titanium oxide TiO sensor in the cavity, which detects ambient nitrogen or oxygen pressure. However, the resistance of the sensor only responds very slowly to pressure changes at room temperature, thus making this approach not very practical.

Pirani sensors or gauges are known in the art for measuring pressure changes. A typical Pirani sensor includes a conductive filament through which a current is passed to heat the filament. If the gas around the filament changes pressure within the designed pressure range, the wire will correspondingly lose different heat to the gas in response thereto, where measuring the heat loss change is a measurement of the pressure. More specifically, the electrical resistance of the filament varies with its temperature, so that the resistance indicates the temperature of the filament. In one embodiment, the filament is maintained at a constant resistance by controlling the current through the filament, where the resistance can be set using a bridge circuit. The current required to achieve this balance is therefore a measure of the pressure. In other embodiments, the filament can be maintained at constant current, voltage or power and the filament temperature changes with pressure.

Known micro-machined Pirani sensors are not specifically designed to be integrated into MMIC circuits. More particularly, the materials used for known Pirani sensors and the fabrication processes involved to produce them are generally not compatible with MMIC fabrication processes, thus making them unsuitable to be integrated with MMIC WLP.

DETAILED DESCRIPTION OF THE EMBODIMENTS

The following discussion of the embodiments of the invention directed to a sensor for detecting leaks in a sealed cavity of a WLP chip is merely exemplary in nature, and is in no way intended to limit the invention or its applications or uses.

Figure 1:
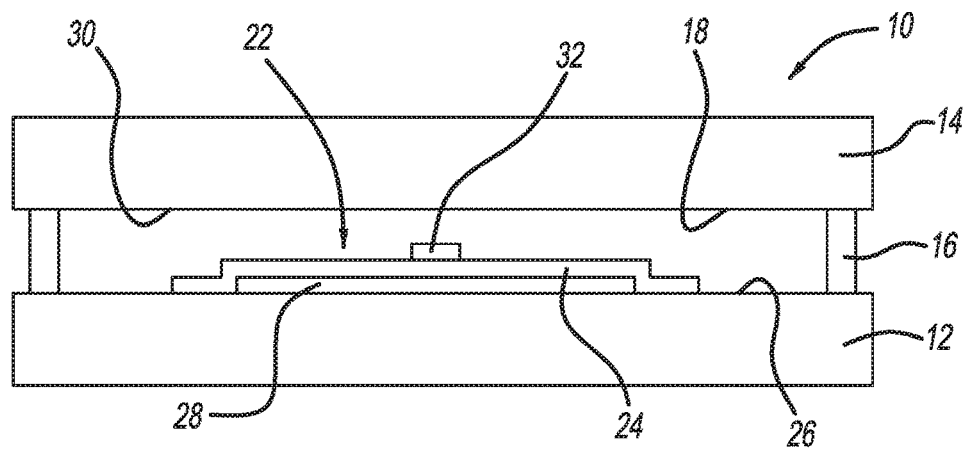
FIG. 1 is a profile view of a WLP chip including a sensor assembly for detecting a leak in a sealed cavity of the chip.

FIG. 1 is a profile view of a WLP chip 10 including a lower substrate wafer 12 and an upper substrate wafer 14 bonded together by a bonding ring 16 to define a hermetically sealed cavity 18 therein. The WLP chip 10 is intended to represent any suitable WLP chip for an MMIC or otherwise having many applications, where none of the circuit elements for the MMIC that would be fabricated within the cavity 18 are shown. During the fabrication process that provides the integrated circuits within the WLP chip 10, a sensor assembly 22 is also fabricated that can be used to measure the integrity of the seal provided by the bonding ring 16 prior to the chip 10 being configured as part of a larger circuit, and can also be used to monitor the pressure within the cavity 18 during chip operation.

As will be discussed herein, the sensor assembly 22 operates as a Pirani-type sensor and includes a membrane 24 having a low thermal conductance fabricated on a surface 26 of the lower substrate wafer 12 within the cavity 18 so that a gas gap 28 is defined between the membrane 24 and the substrate wafer 12, as shown, where, for example, the gap 28 may be about 5000 Å or less. Although the membrane 24 is shown formed to the substrate wafer 12, this is by way of a non-limiting example in that the membrane 24 could be formed to an inside surface 30 of the upper wafer 14. The membrane 24 is made of a suitable dielectric that is compatible with the wafer level packaging and MMIC fabrication processes and can be, for example, benzocyclobutene (BCB) or polyimide. However, any suitable and compatible material can be provided as the membrane 24 that has a relatively low thermal conductivity, which reduces the amount of heat that escapes from the membrane 24 through the solid structure, and therefore ensures a high percentage of the total heat dissipated through the gas gap 28 for high sensitivity. Further, the membrane 24 is circular to provide stress uniformity. A resistive element 32 is fabricated on a surface of the membrane 24 opposite to the substrate wafer 12 and operates as both a heater and a temperature detector, where the element 32 can be made of any suitable material compatible with the WLP and/or the MMIC processes. In an alternate embodiment, the element 32 may be fabricated on a surface of the membrane facing the wafer 12. In one non-limiting embodiment, the resistive element 32 is made of nichrome (NiCr) or platinum (Pt).

A current from a current source (not shown) is provided to the element 32 that heats the membrane 24 as determined by the amount of current and the resistance of the element 32. The gas pressure in the cavity 18 will determine how much of that heat is dissipated through the gap 28. In the designed pressure range, the more gas that is present, the more heat will dissipate from the membrane 24 causing its temperature to be reduced, which reduces its resistance, which is detected by the element 32. Therefore, if the cavity 18 is hermetically sealed and the current remains constant, the resistance and temperature of the element 32 that is sensed will be a certain and constant value. If the cavity 18 is not hermetically sealed and gas is leaking into the cavity 18 and the current remains constant, the resistance and temperature of the element 32 will be decrease, and that decrease will provide an indication of the extent of the leak, which is capable of detecting leaks on the order of $1 \times 10^{-10}$ atm cc/sec or less.

Figure 2:
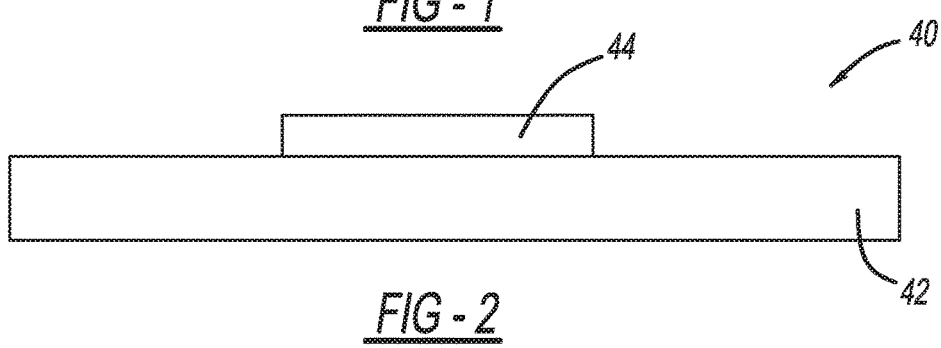
FIGS. 2-7 are profile views of processing steps for fabricating a sensor assembly of the type shown in FIG. 1.
Figure 3:
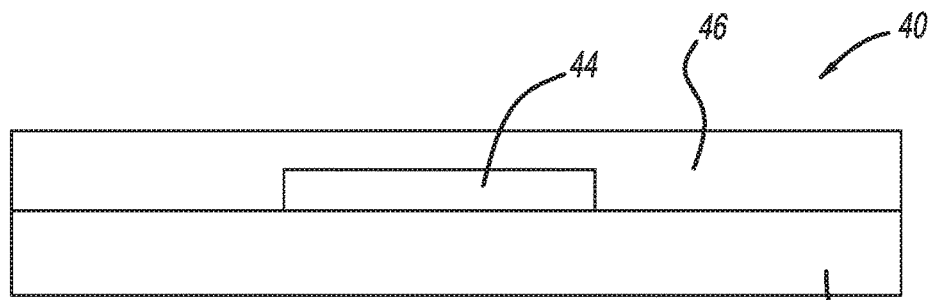
Figure 4:
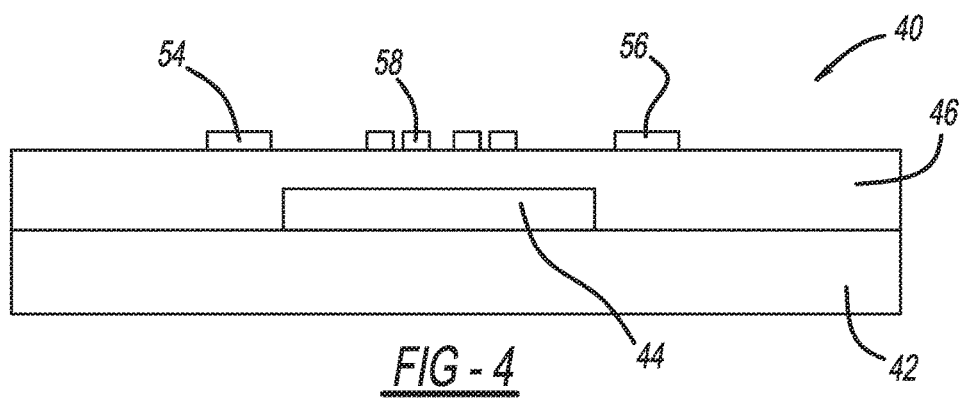
Figure 5:
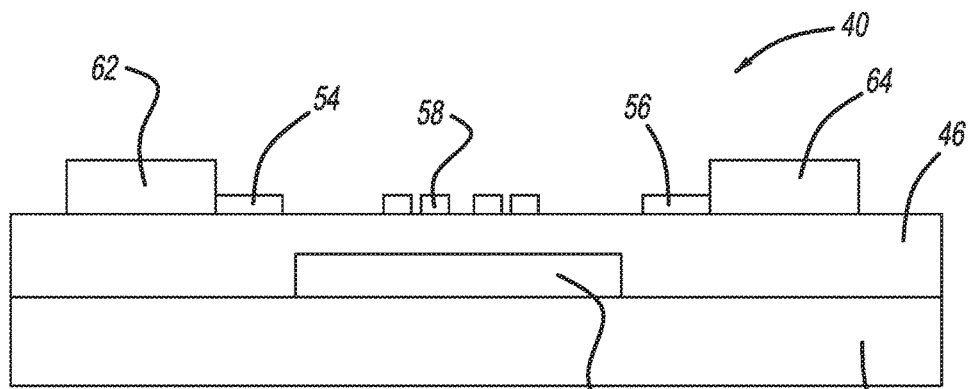
Figure 6:
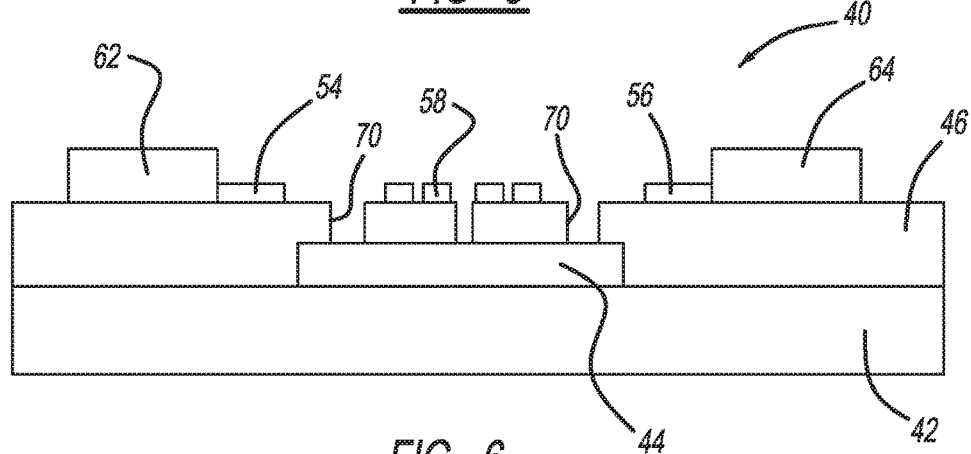
Figure 7:
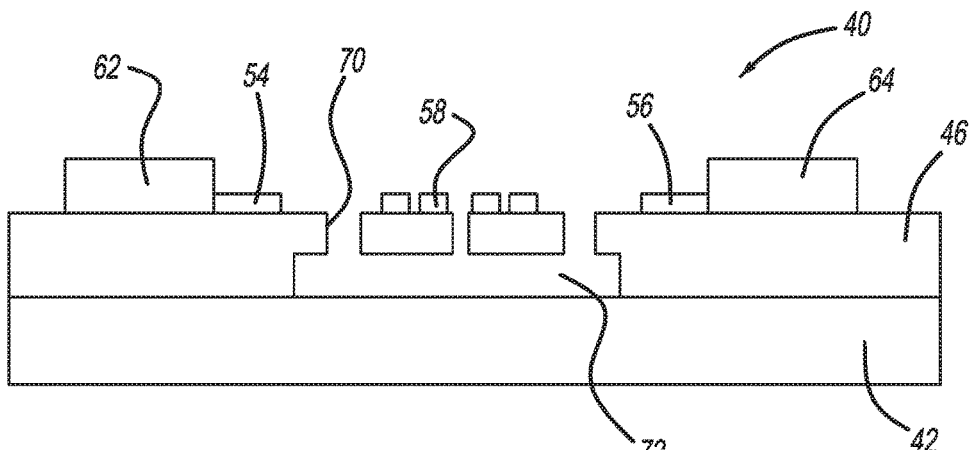

FIGS. 2-7 are profile views showing consecutive fabrication steps of a sensor assembly 40 similar to the sensor assembly 22. The sensor assembly 40 includes a substrate wafer 42, such as a 500 μm thick GaAs wafer having a SiN layer, where the bonding ring and the other substrate wafer defining the sealed cavity are not shown in FIGS. 2-7 merely for clarity purposes. Other substrates, such as InP or SiC can also be employed. The first step includes photo-patterning a mask and depositing a sacrificial layer 44 on a top surface of the wafer 42, as shown in FIG. 2. The sacrificial layer 44 can be any suitable sacrificial material compatible with the WLP fabrication process, such as layers of aluminum and titanium (Al/Ti). The next step includes depositing a compatible membrane layer 46 over the top surface of the wafer 42 and the sacrificial layer 44, which can be BCB, a polyimide, a multi-layer structure of SiN/BCB/SiN, etc., where the membrane layer 46 is cured, as shown in FIG. 3. The next step includes depositing and patterning conductive terminals 54 and 56 and a heater and a temperature sensor 58 on a top surface of the membrane layer 46 opposite to the wafer 42, as shown in FIG. 4. In an alternate embodiment, it may be desirable but optional to deposit a thermocouple (not shown) on the membrane layer 46 in association with the sensor 58 that may be better able to detect temperature changes than the resistive element. Metal contact pads 62 and 64 are then deposited and patterned on a top surface of the membrane layer 46, where the pad 62 makes electrical contact with the terminal 54 and the pad 64 makes electrical contact with the terminal 56, as shown in FIG. 5. The sensor assembly 40 is then patterned and etched, such as with a reactive ion etch (RIE), to form channels 70 through and on at least two sides of the membrane layer 46 to expose a portion of the sacrificial layer 44 below, as shown in FIG. 6. The sensor assembly 40 is then immersed in a suitable solvent to dissolve the sacrificial layer 44 through the channels 70 to define a gap 72 to release the membrane 46, as shown in FIG. 7.

Figure 8:
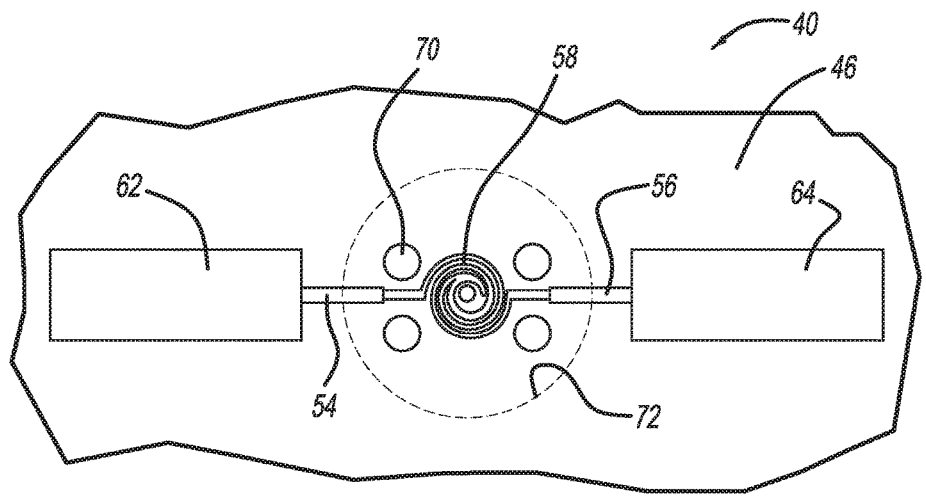
FIG. 8 is a top view of the sensor assembly shown in FIG. 7.

FIG. 8 is a top view of the sensor assembly 40 in its final fabrication stage as shown in FIG. 7, where it is apparent that the sensor 58 is configured in a spiral configuration in this non-limiting embodiment. The dotted circle represents the gap 72.

Figure 9:
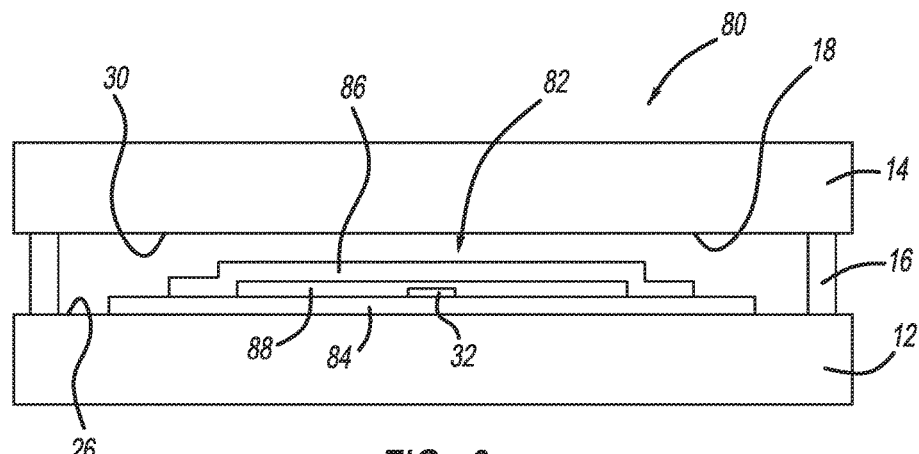
FIG. 9 is a profile view of a WLP chip including another sensor assembly for detecting a leak in a sealed cavity of the chip.

FIG. 9 is a profile view of a WLP chip 80 that is similar to the WLP chip 10, where like elements are identified by the same reference number. In this embodiment, the chip 80 includes a sensor assembly 82 having a thermal insulation layer 84 deposited on the top surface 26 of the substrate wafer 12, and can be, for example, BCB or polyimide. A metal air bridge 86, such as gold, is formed on a surface of the thermal insulation layer 84 opposite to the wafer 12 to define a gas gap 88 therebetween where, for example, the gap 88 may be about 1 μm or less. The resistive element 32 is provided on the thermal insulation layer 84 within the gap 88, as shown. As above, a constant current provided to the element 32 heats the layer 84. If the cavity leaks and the pressure therein increases, in the designed pressure range, more heat will be dissipated through the gap 88, which will reduce the temperature and resistance of the element 32, which is detected. It is noted that although the sensor assembly 82 is effective in detecting leaks from the cavity 18 as discussed herein, its performance is somewhat less than the sensor assembly 22, which is due to the relatively larger heat dissipation through the insulation layer 84 to the substrate 12. Low thermal conductivity materials, such as aerogel, may be used in the insulation layer 84 to improve the performance of the sensor 82.

Figure 10:
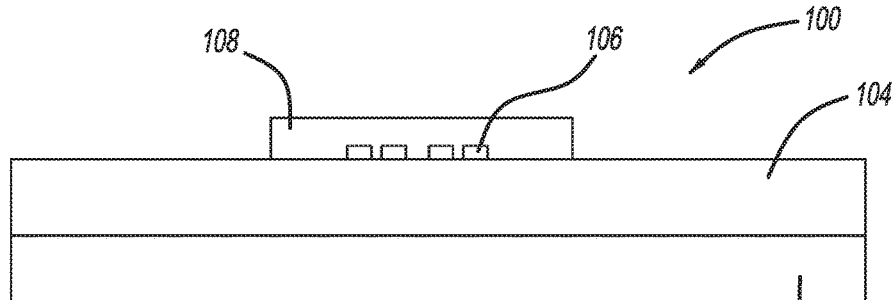
FIGS. 10-12 are profile views of processing steps for fabricating a sensor assembly of the type shown in FIG. 9.
Figure 11:
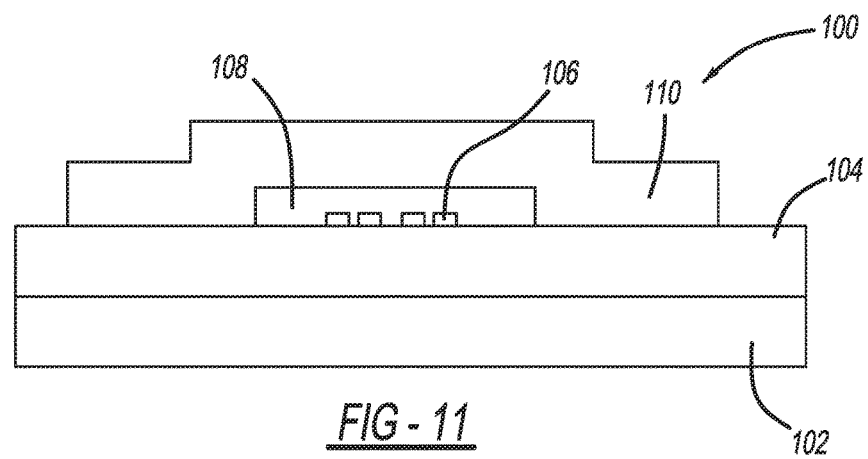
Figure 12:
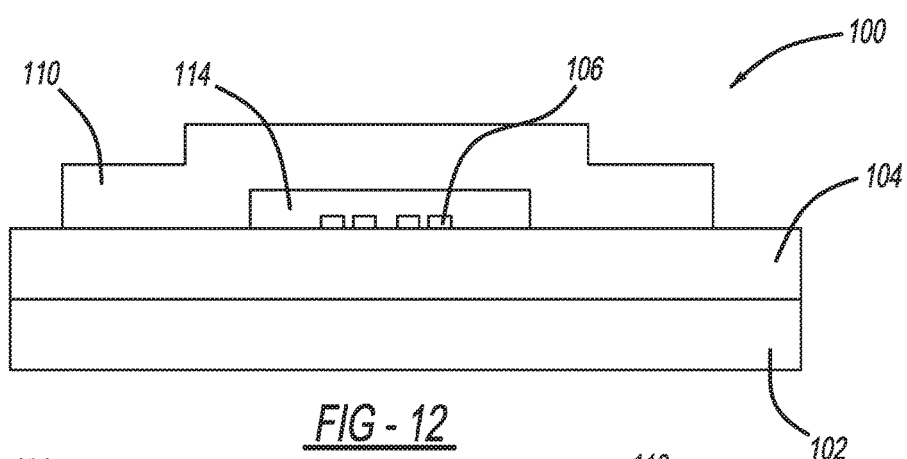
Figure 13:
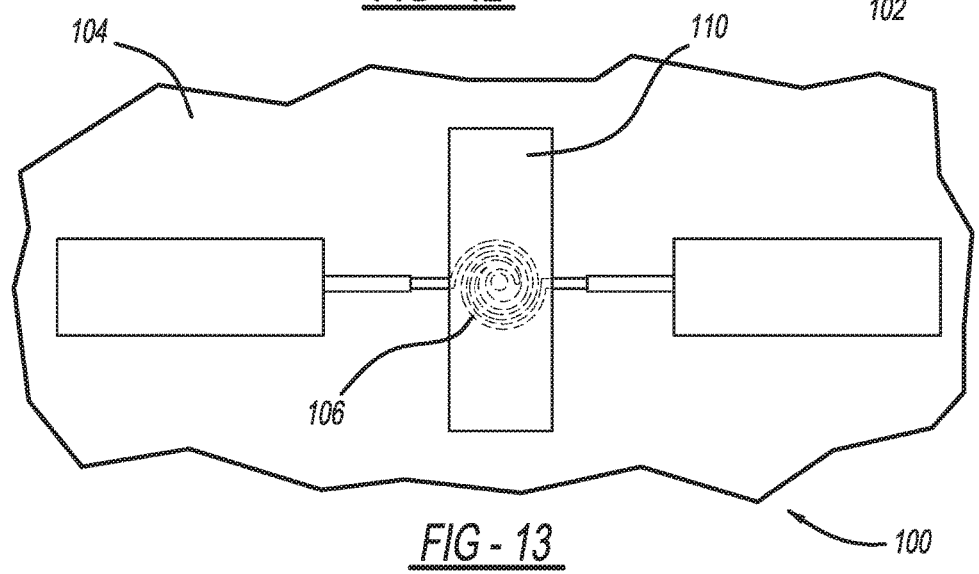
FIG. 13 is a top view of the sensor assembly shown in FIG. 12.

FIGS. 10-13 are profile views showing processing steps of a sensor assembly 100 that is similar to the sensor assembly 82. FIG. 10 shows a wafer substrate 102 and a thermal insulation layer 104 deposited on the substrate wafer 102, similar to the insulation layer 84. A heater and a temperature sensor 106 is then deposited and patterned on a surface of the insulation layer 104 opposite to the wafer 102, and a sacrificial layer 108 is deposited over the sensor 106, as also shown in FIG. 10. An air bridge layer 110 is then deposited over the sacrificial layer 108, as shown in FIG. 11, and the sacrificial layer 108 is removed using a suitable etch to define a gap 114 as shown in FIG. 12. FIG. 13 is a top view of the sensor assembly 100 in its final fabrication stages as shown in FIG. 12, where it is apparent that the sensor 16 is a spiral sensor.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A sensor assembly for determining whether a hermetically sealed cavity between opposing substrate wafers in a wafer level packaged (WLP) chip is leaking, said sensor assembly comprising:
    a membrane secured to a surface of one of the wafers within the cavity so as to define a gas gap between the membrane and the one wafer; and
    a resistive element deposited on the membrane, said resistive element being responsive to a current that heats the membrane so that heat dissipated by the membrane is drawn away by gas within the cavity that determines the temperature of the resistive element, which is detected.

2. The sensor assembly according to claim 1 wherein the membrane is a benzocyclobutene (BCB) membrane.

3. The sensor assembly according to claim 1 where the membrane is a polyimide membrane.

4. The sensor assembly according to claim 1 wherein the membrane is circular.

5. The sensor assembly according to claim 1 wherein the membrane includes openings on at least two sides to allow for membrane release during fabrication of the assembly.

6. The sensor assembly according to claim 1 wherein the resistive element is a nichrome or platinum element.

7. The sensor assembly according to claim 1 wherein the resistive element has a spiral configuration.

8. The sensor assembly according to claim 1 wherein the substrate wafers are GaAs, InP or SiC wafers.

9. The sensor assembly according to claim 1 wherein the gas gap has a thickness of about 5000 Å or less.

10. The sensor assembly according to claim 1 wherein the WLP chip hermetically seals a monolithic microwave integrated circuit (MMIC).

11. The sensor assembly according to claim 1 wherein the resistive element is a heater and temperature sensor.

12. A sensor assembly for determining whether a hermetically sealed cavity between opposing substrate wafers in a wafer level package (WLP) chip is leaking, said sensor assembly comprising:
  a thermal insulation layer deposited on a surface of one of the wafers within the cavity;
  an air bridge formed to the insulation layer and defining a gap therebetween; and
  a resistive element formed on the insulation layer, said resistive element being responsive to a current that heats the thermal insulation layer so that heat drawn away by gas within the gap determines the temperature of the resistive element, which is detected.

13. The sensor assembly according to claim 12 wherein the thermal insulation layer is a benzocyclobutene (BCB) thermal insulating layer.

14. The sensor assembly according to claim 12 where the thermal insulation layer is a polyimide thermal insulating layer.

15. The sensor assembly according to claim 12 wherein the resistive element is a nichrome or platinum element.

16. The sensor assembly according to claim 12 wherein the resistive element has a spiral configuration.

17. The sensor assembly according to claim 12 wherein the resistive element is a heater and temperature sensor.

18. A sensor assembly for determining whether a hermetically sealed cavity between opposing substrate wafers and a wafer level packaged (WLP) chip is leaking, said sensor assembly comprising:
  a thermal insulating layer provided within the cavity; and
  a heater and temperature sensor deposited on the insulation layer, said sensor being responsive to a current that heats the thermal insulation layer so that heat dissipated by the thermal insulation layer is drawn away by gas within the cavity that determines the temperature of the sensor, which is detected.

19. The sensor assembly according to claim 18 wherein the thermal insulating layer is a benzocyclobutene (BCB) thermal insulating layer or a polyimide thermal insulating layer.

20. The sensor assembly according to claim 18 wherein the sensor has a spiral configuration.

* * * * *